United States Patent
Yoon et al.

(10) Patent No.: US 12,334,769 B2
(45) Date of Patent: Jun. 17, 2025

(54) METHOD FOR ESTABLISHING LITHIUM SECONDARY BATTERY CHARGING PROTOCOL, BATTERY MANAGEMENT SYSTEM, BATTERY PACK, AND BATTERY CELL CHARGING DEVICE

(71) Applicant: LG Energy Solution, Ltd., Seoul (KR)

(72) Inventors: Yeo Kyung Yoon, Daejeon (KR); Jeong In Yu, Daejeon (KR); Yong Jun Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/840,058

(22) PCT Filed: Nov. 8, 2023

(86) PCT No.: PCT/KR2023/017912
§ 371 (c)(1),
(2) Date: Aug. 20, 2024

(87) PCT Pub. No.: WO2024/101897
PCT Pub. Date: May 16, 2024

(65) Prior Publication Data
US 2025/0112485 A1    Apr. 3, 2025

(30) Foreign Application Priority Data
Nov. 8, 2022  (KR) .................. 10-2022-0147927

(51) Int. Cl.
*H02J 7/00*    (2006.01)
*G01R 31/388*    (2019.01)
*G01R 31/389*    (2019.01)

(52) U.S. Cl.
CPC ........ *H02J 7/00712* (2020.01); *G01R 31/388* (2019.01); *G01R 31/389* (2019.01)

(58) Field of Classification Search
CPC .. H02J 7/00712; G01R 31/388; G01R 31/389
(Continued)

(56) References Cited

U.S. PATENT DOCUMENTS 11,927,640 B2 * 3/2024 Han ................... G01R 31/3835
2012/0323512 A1 * 12/2012 Rhodin .............. G01R 31/3842
702/63

(Continued)

FOREIGN PATENT DOCUMENTS

JP           5366601 B2     12/2013
JP        2014068467 A      4/2014
(Continued)

*Primary Examiner* — M Baye Diao
(74) *Attorney, Agent, or Firm* — Bryan Cave Leighton Paisner LLP

(57) ABSTRACT

Systems and methods for charging protocols for secondary batteries are provided including: measuring an open-circuit voltage (Vref) according to a state-of-charge ($SOC_x$) for a two-electrode cell, charged with a reference current; measuring second open-circuit voltages ($V_c$) according to the state-of-charge when charging the cell with a plurality of different charging currents; calculating an internal resistance value ($R_{SOCx}$) according to the state-of-charge using an equation ($R_{SOCx}$)=($V_c-V_{ref}$)/Ic for the different charging currents, wherein Ic is a value for the different charging currents, and computing a charging current-specific internal resistance profile mapping the internal resistance value according to the state-of-charge for the different charging currents; and identifying, for the charging current-specific internal resistance profiles, each inflection point, determining a lowest resistance value among the inflection points as a reference value, and determining, for the computed charging current-specific internal resistance profiles, the state-of-charge having the reference value as a limit state-of-charge.

16 Claims, 10 Drawing Sheets

(58) Field of Classification Search
USPC .......................................................... 320/162
See application file for complete search history.

(56) References Cited

U.S. PATENT DOCUMENTS

| | | | |
|---|---|---|---|
| 2014/0214347 A1* | 7/2014 | Laskowsky | G01R 31/367 |
| | | | 702/63 |
| 2014/0312910 A1* | 10/2014 | Cho | G01R 31/3842 |
| | | | 324/426 |
| 2019/0072618 A1 | 3/2019 | Ghantous | |
| 2019/0123565 A1* | 4/2019 | Hsiao | G01R 31/374 |
| 2019/0202299 A1 | 7/2019 | Oh et al. | |

FOREIGN PATENT DOCUMENTS

| | | |
|---|---|---|
| JP | 2020145799 A | 9/2020 |
| KR | 20170021630 A | 2/2017 |
| KR | 20180033899 A | 4/2018 |
| KR | 102066702 B1 | 3/2020 |
| KR | 20220043447 A | 4/2022 |
| KR | 20220059383 A | 5/2022 |
| KR | 20220094905 A | 7/2022 |

* cited by examiner

METHOD FOR ESTABLISHING LITHIUM SECONDARY BATTERY CHARGING PROTOCOL, BATTERY MANAGEMENT SYSTEM, BATTERY PACK, AND BATTERY CELL CHARGING DEVICE

CROSS-REFERENCE TO RELATED APPLICATIONS

This application is a National Phase entry pursuant to 35 U.S.C. § 371 of International Application No. PCT/KR2023/017912 filed on Nov. 8, 2023, which claims priority to and the benefit of Korean Patent Application No. KR 10-2022-0147927, filed on Nov. 8, 2022. The contents of the above-identified applications are herein incorporated by reference in their entireties.

TECHNICAL FIELD

The present disclosure relates to a method for establishing a quick charging protocol that considers heat generation and internal resistance due to charging and discharging of a large capacity battery cell, a battery management system capable of establishing such a quick charging protocol, a battery pack including the same, and a charging device for battery cells using the same.

BACKGROUND

In recent years, the demand for portable electronic products such as laptops and portable phones has increased dramatically, and the demand for electric carts, electric wheelchairs, and electric bicycles has also increased, and research on high-performance batteries that can be repeatedly charged and discharged has been actively conducted. In recent years, the demand for hybrid electric vehicles (HEVs) and electric vehicles (EVs) has also been increasing worldwide as carbon-based energy is gradually depleting and environmental concerns are rising. As a result, more attention and research are being focused on vehicle batteries, which are the core components of HEVs and EVs, and there is an urgent need to develop quick charging technologies that can quickly recharge batteries. Quick charging is a critical capability, especially for EVs that do not have an additional energy source.

The process of charging a battery involves introducing current into the battery to build up charge and energy, and this process must be carefully controlled. In general, excessive charging current (C-rate) or charging voltage can permanently degrade the performance of a battery and ultimately cause complete failure, or cause a sudden failure such as a leak or explosion of highly corrosive chemicals.

When charging a battery with a constant current, if the current rate of the charging current is small, a very long time is required to fully charge the battery. On the other hand, if the current rate of the charging current is too high, the battery will quickly degrade. Therefore, during constant current charging, it is necessary to gradually adjust the current rate of the charging current according to the state of the battery.

A charge map with a "multi-stage constant-current charging protocol" is often utilized to adjust the current rate during constant-current charging in a stepwise manner. The charge map includes at least one data array in which a relationship between a plurality of current rates and a plurality of transition conditions is recorded. Whenever each transition condition is satisfied, the following sequence of current rates can be supplied to the battery as charging current. A current rate (which may also be referred to as a 'C-rate') is the charging current divided by the maximum capacity of the battery, using the unit 'C'.

Conventionally, to derive such a multi-stage constant-current charging protocol, a 50 mAh mono-cell type three-electrode cell was manufactured, and the state of charge (SOC) at which Li-plating occurs at the negative electrode for each charging current was established as the charging limit.

However, three-electrode cells are difficult to manufacture and require a dedicated charger and discharger to charge and discharge, so there are many constraints such as the completeness of the three-electrode cell, the manufacturing time of the three-electrode cell, the preparation of the dedicated charger and discharger, and the like. In addition, when applying the limited state of charge identified in these three-electrode cells to large capacity battery cells with capacities in the range of 40-200 Ah, there is no technology that reflects the resistance of large capacity battery cells or the heat generation during quick charging.

In addition, the method of establishing charging protocols using three-electrode cells is subject to the experimenter's subjectivity as the Li-plating zones are not clearly distinguished as the charging current becomes smaller and as the negative electrode composition becomes more favorable for quick charging, making it difficult to establish charging protocols that exhibit similar voltage profiles in case of deviations in the battery cells.

Therefore, it is necessary to develop a technology that derives a charging protocol that does not require manufacturing of a three-electrode cell, but considers the resistance of a large capacity battery cell and the heating state during quick charging.

The background description provided herein is for the purpose of generally presenting context of the disclosure. Unless otherwise indicated herein, the materials described in this section are not prior art to the claims in this application and are not admitted to be prior art, or suggestions of the prior art, by inclusion in this section.

SUMMARY

The present disclosure is designed to solve the above problems, and aims to provide a method for deriving a charging protocol that does not require manufacturing a three-electrode cell in advance to derive a limit state of charge by charging current, a method for deriving a charging protocol that takes into account the resistance of a large capacity battery cell and the heating state during quick charging, a battery management system capable of establishing such a charging protocol, and a battery pack and charging device equipped with such a system.

According to one embodiment of the present disclosure, a method of establishing a charging protocol for a lithium secondary battery is provided. The method for establishing a lithium secondary battery charging protocol may include:

(a) measuring a first open-circuit voltage ($V_{ref}$) according to a state-of-charge ($SOC_x$) for a two-electrode battery cell with a positive electrode and a negative electrode, when charged with a reference current;

(b) measuring a plurality of second open circuit voltages ($V_c$) according to the state-of-charge ($SOC_x$) when charging the two-electrode battery cell with a plurality of different charging currents;

(c) calculating an internal resistance value ($R_{SOCx}$) according to the state-of-charge ($SOC_x$) using an equation $(R_{SOCx})=(V_c-V_{ref})/Ic$ for each of the different charging currents, wherein Ic is a current value for each of the different charging currents, and computing a charging current-specific internal resistance profile mapping the internal resistance value according to the state-of-charge $(SOC_x)$ for each of the different charging currents; and (d) identifying, for each of the computed charging current-specific internal resistance profiles, each inflection point at which the internal resistance value $(R_{SOCx})$ changes from an increasing trend to a decreasing trend, determining a lowest resistance value among the inflection points for each of the different charging currents as a reference resistance value, and determining, for each of the computed charging current-specific internal resistance profiles, the state-of-charge $(SOC_x)$ having the reference resistance value as a limit state-of-charge.

In an exemplary embodiment of the present disclosure, at least one inflection point may be an inflection point corresponding to a second inflection point when a computed charging current-specific internal resistance profile is 'W' shaped.

In an exemplary embodiment of the present disclosure, at least one inflection point may be located within an interval between SOC 40% and SOC 60%.

In an exemplary embodiment of the present disclosure, the two-electrode battery cell may have a capacity between 40 Ah and 200 Ah.

In an exemplary embodiment of the present disclosure, the reference current in process (a) may be between approximately 0.25 C and approximately 0.4 C.

In an exemplary embodiment of the present disclosure, each of the different charging currents may be between approximately 0.2 C and approximately 6 C.

In an exemplary embodiment of the present disclosure, charging the two-electrode battery cell with the plurality of different charging currents in (b) may comprise charging the two-electrode battery cell to between approximately SOC 50% and approximately SOC 100% for each of the different charging currents.

In an exemplary embodiment of the present disclosure, the plurality of different charging currents may increase in a stepwise manner from a lower to a higher current.

The method for establishing a lithium secondary battery charging protocol in an exemplary embodiment of the present disclosure may further include mapping the lithium secondary battery charging protocol based on the limit state-of-charge for each of the different charging currents, wherein each charging current of the lithium secondary battery charging protocol may be below the limit state-of-charge for each of the different charging currents, and the charging current of the lithium secondary battery charging protocol may decrease as the state-of-charge increases.

In an exemplary embodiment of the present disclosure, the lithium secondary battery charging protocol extends to a state-of-charge below 55% SOC.

In an exemplary embodiment of the present disclosure, (b) may further comprise, between measuring the open circuit voltage (Vc) according to the state-of-charge (SOCx) when charging the two-electrode battery cell with each of the plurality of different charging currents performing charge/discharge compensation, wherein charge/discharge compensation may comprise: discharging the two-electrode battery cell with the reference current; charging the two-electrode battery cell with the reference current; and discharging the two-electrode battery cell with the reference current.

According to another exemplary embodiment of the present disclosure, a battery management system is provided. The battery management system may include: a voltage measurement portion for measuring: (1) a first open-circuit voltage $(V_{ref})$ according to a state-of-charge $(SOC_x)$ for a two-electrode battery cell with a positive electrode and a negative electrode, when charged with a reference current and (2) a plurality of second open circuit voltages $(V_c)$ according to the state-of-charge $(SOC_x)$ when charging the two-electrode battery cell with a plurality of different charging currents;

a memory portion for calculating an internal resistance value (RSOCx) according to the state-of-charge (SOCx) using an equation (RSOCx)=(Vc−Vref)/Ic for each of the different charging currents, wherein Ic is a current value for each of the different charging currents, and for computing a charging current-specific internal resistance profile mapping the internal resistance value according to the state-of-charge (SOCx) for each of the different charging currents; and a control portion for identifying for each of the computed charging current-specific internal resistance profiles, each inflection point at which the internal resistance value $(R_{SOCx})$ changes from an increasing trend to a decreasing trend, for determining a lowest resistance value among the inflection points for each of the different charging currents as a reference resistance value, and for determining, for each of the computed charging current-specific internal resistance profiles, the state-of-charge $(SOC_x)$ having the reference resistance value as a limit state-of-charge.

In an exemplary embodiment of the present disclosure, the control portion may identify at least one inflection point corresponding to a second inflection point when a computed charging current-specific internal resistance profile is 'W' shaped.

A battery management system according to an exemplary embodiment of the present disclosure may further include a connecting portion for connecting to a charging portion for supplying a charging current according to a charging protocol established by the control portion.

According to another exemplary embodiment of the present disclosure, a battery pack is provided. The battery pack may include a battery management system as disclosed herein.

According to another exemplary embodiment of the present disclosure, a battery pack charging device is provided, and the battery pack charging device may include: a battery management system as disclosed herein; and a charging unit for supplying a charging current to a battery cell of the battery pack according to a charging protocol, wherein the charging protocol limits the charging current according to a limit state-of-charge determined by the control portion.

A method of setting charging protocol, a battery management system, and a charging device mounting the same according to the present disclosure have the effect of providing a charging protocol that reflects resistance and heat directly from a large capacity battery cell, without the need to manufacture a cumbersome three-electrode cell.

Technical objects to be achieved by the present disclosure are not limited to the technical objects mentioned herein, and other technical objects not mentioned will be clearly understood by those skilled in the art from the description below.

BRIEF DESCRIPTION OF THE DRAWINGS

The accompanying drawings illustrate various embodiments of the present disclosure and together with the foregoing disclosure, serve to provide further understanding of the technical features of the present disclosure, and thus, the present disclosure is not construed as being limited to the drawings.

FIG. 1 is a flowchart to illustrate a method of establishing a charging protocol according to an exemplary embodiment of the present disclosure.

DETAILED DESCRIPTION

Figure 1:
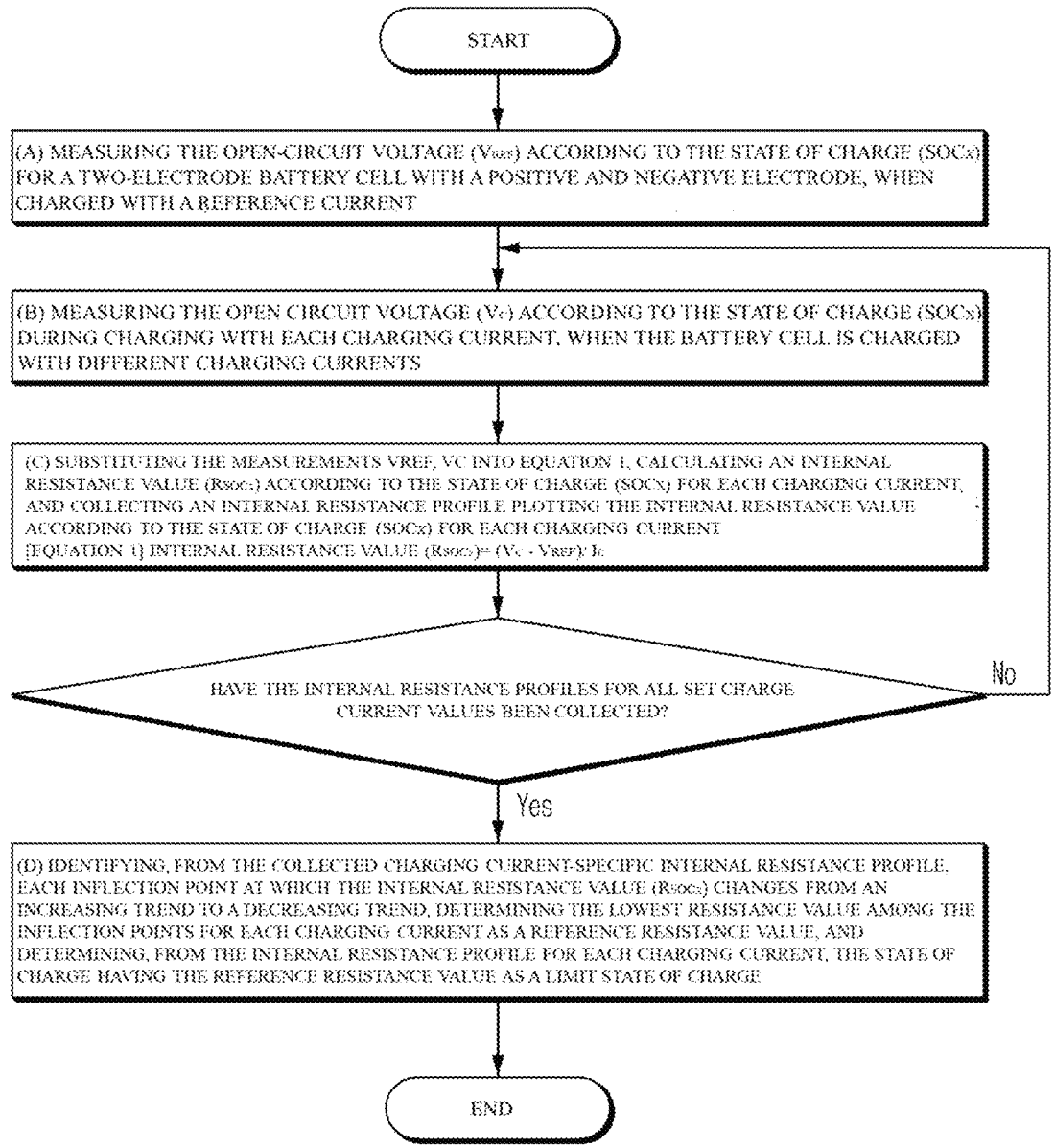

Accordingly, it is to be understood that the embodiments described herein and the configurations illustrated in the drawings are only various embodiments of the present disclosure and do not represent all of the technical ideas of the present disclosure, and that there may be various equivalents and variations that may be substituted for them at the time of filing the application.

In addition, in describing various embodiments, detailed descriptions of related known configurations or features are omitted where it is determined that such detailed descriptions would obscure the essence of the present disclosure.

Throughout the specification, when a part is said to "include" a component, it means that it may further include other components, not that it excludes other components, unless specifically stated to the contrary.

In addition, terms such as control portion as used in the specification refer to a unit that handles at least one function or operation, which may be implemented in hardware or software, or a combination of hardware and software.

In addition, throughout the specification, when a part is said to be "connected" to another part, this includes not only "directly connected" but also "indirectly connected" with other elements in between.

Hereinafter, various embodiments of the present disclosure will be described in detail with reference to the accompanying drawings.

FIG. 1 is a flowchart to illustrate a method of establishing a charging protocol according to an exemplary embodiment of the present disclosure.

Referring to FIG. 1, a method of establishing a charging protocol according to an exemplary embodiment of the present disclosure includes (a) measuring the open-circuit voltage ($V_{ref}$) according to the state of charge ($SOC_x$) for a two-electrode battery cell with a positive and negative electrode, when charged with a reference current;

(b) measuring the open circuit voltage ($V_c$) according to the state of charge ($SOC_x$) during charging with each charging current, when the battery cell is charged with different charging currents;

(c) substituting the measurements $V_{ref}$, $V_c$ into Equation 1 below, calculating an internal resistance value ($R_{SOCx}$) according to the state of charge ($SOC_x$) for each charging current, and collecting an internal resistance profile plotting the internal resistance value according to the state of charge ($SOC_x$) for each charging current; and (d) identifying, from the collected charging current-specific internal resistance profile, each inflection point at which the internal resistance value ($R_{SOCx}$) changes from an increasing trend to a decreasing trend, determining the lowest resistance value among the inflection points for each charging current as a reference resistance value, and determining, from the internal resistance profile for each charging current, the state of charge having the reference resistance value as a limit state of charge.

$$\text{Internal resistance value } (R_{SOCx}) = (V_c - V_{ref})/Ic \qquad \text{[Equation 1]}$$

(In the above Equation 1, Ic means the applied current value for each charging current)

The method for establishing a charging protocol for a lithium secondary battery according to the present disclosure introduces the concept of an internal resistance by charging current to reflect the resistance and heating of large capacity battery cells. In the present disclosure, this internal resistance is defined as the resistance of the overvoltage generated during charging divided by the applied current at a given state of charge ($SOC_x$).

When the open-circuit voltage according to the state of charge is measured while performing quick charging and slow charging, the open-circuit voltage ($V_c$) in the case of quick charging is higher than the open-circuit voltage ($V_{ref}$) in the case of slow charging, even at the same state of charge, and the present disclosure defines the internal resistance as the difference in the open-circuit voltage ($V_c - V_{ref}$) according to different charging currents divided by the applied current (Ic).

The inventors of the present disclosure have analyzed internal resistance profiles plotting internal resistance values according to the state of charge by charging current (Ic) and found that the internal resistance profiles by charging current (Ic) generally have a graph shape in which, in an initial state of charge interval, the internal resistance value decreases, then increases, then decreases again, then increases, and among these inflection points that change from an increasing trend to a decreasing trend, the state of charge representing the reference resistance value with the lowest resistance value is determined as the limit state of charge, and the limit state of charge by charging current reflects the resistance or heating state of a large capacity battery cell, and discovered a characteristic that appears at a similar level in battery cells with the same capacity, even if the footprint is different, thereby leading to the present disclosure.

In other words, if the battery cells have different footprints, the reference resistance values of the battery cells may vary, but the limit state of charge by charging current with the reference resistance value is similar, so the charging protocol establishment method of the present disclosure has the effect of presenting a method for establishing a charging protocol based on the same criteria despite deviations between battery cells. Furthermore, through the reference resistance value, a limit state of charge that reflects the capacity and internal resistance of the battery cell can be derived for each charge current.

In the present disclosure, the battery cell is a two-electrode battery cell having a negative electrode and a positive electrode, which is a single, physically separable cell. In one example, a pouch-type lithium polymer cell may be considered as a battery cell 10. Further, the battery cell may be a large capacity battery cell having a capacity in the range of 40 to 200 Ah.

As a positive electrode active material comprising the positive electrode of the battery cell 10, a lithium-containing transition metal oxide may be used. For example, $LiCoC_2$, $LiNiO_2$, $LiMnO_2$, $LiMn_2O_4$, $Li(Ni_a Co_b Mn_c)O_2$ ($0<a<1$, $0<b<1$, $0<c<1$, $a+b+c=1$), $Li_x(Ni_a Co_b Mn_c Al_d)O_2$ ($0.5<x<1.3$, $0.6<a<1$, $0<b<0.2$, $0<c<0.1$, $0<d<0.1$, $a+b+c+d=1$), $LiNi_{1-y}Co_yO_2$, $LiCo_{1-y}Mn_yO_2$, $LiNi_{1-y}Mn_yO_2$ ($0\leq y<1$), $Li(Ni_a Co_b Mn_c)O_4$ ($0<a<2$, $0<b<2$, $0<c<2$, $a+b+c=2$), $LiMn_{2-z}Ni_zO_4$, $LiMn_{2-z}CO_zO_4$ ($0<z<2$), $LiCoPO_4$, $LiFePO_4$, or two or more of these may be used. In addition to these oxides, it may also be a sulfide, a selenide, a halide, and the like.

As a negative electrode active material that comprises the negative electrode, a carbon-based materials such as graphite or activated carbon, or a material such as silicon oxide ($SiO_x$) may be used.

For negative electrode active materials using carbon-based materials, the potential is very low, similar to that of Li, so that an increase in resistance or an increase in current will cause Li-plating, which forms a metal-coated film on the negative electrode due to the nature of the lithium ions. Therefore, a safe charging protocol is established by defining the state of charge at which Li-plating occurs at the negative electrode as the limit state of charge.

In order to determine a limit state of charge per charging current, the method of establishing a quick charging protocol of the present disclosure first obtains an internal resistance profile for each charging current, analyzes the internal resistance profiles to determine a reference resistance value, and determines a state of charge representing the reference resistance value in the internal resistance profile as a limit state of charge. Here, the internal resistance profiles for each charging current may be obtained by the processes (a) to (c) above.

Processes (a) and (b) are processes of charging a battery cell, for various values of charging current, to obtain an open circuit voltage according to the state of charge, in order to calculate an internal resistance value as defined according to the present disclosure.

As mentioned above, in the present disclosure, the internal resistance value is the overvoltage at a given state of charge divided by the applied current, wherein the overvoltage is the difference in open circuit voltage resulting from the difference between the reference current and the charging current.

The process (a) is to charge the battery cell with a reference current, which is a relatively low value charging current that serves as a reference, while measuring the open circuit voltage ($V_{ref}$) according to the state of charge ($SOC_x$). In the present specification, the current applied in the process (a) is defined as the reference current. And the charging current value of such reference current may be from 0.25° C. to 0.4 C. More specifically, the charging current may be from 0.25° C. to 0.33 C.

The process (b) is to measure the open circuit voltage ($V_c$) according to the state of charge ($SOC_x$) while charging the battery cell with a charging current of a value relatively higher than the reference current. In the present disclosure, when charging the battery cell, the process of measuring the open circuit voltage (V) according to the state of charge ($SOC_x$) while applying various values of charging current is repeated for each charging current.

In one specific example, the charging current applied in the process (b) may be plurally selected within a range of 0.2 C to 6C, more specifically 0.33 C to 6 C. For example, the charging current may be plurally selected in a range of 0.5 C to 3.0 C, with an interval of 0.25 C. In such a case, the process may include performing charging at each of the charging currents of 0.5 C, 0.75 C, 1.0 C, 1.25 C, 1.5 C, 1.75 C, 2.0 C, 2.25 C. 2.5 C. 2.75 C. 3.0 C, while measuring an open circuit voltage ($V_c$) according to the state of charge ($SOC_x$) for each charging current during charging.

In addition, during the charging process for one charge current value, the battery cells to be charged are targeted to be in a near-full discharge state with a state of charge of 0% to 5% (SOC 0% to 5%), and the battery cells are charged until they reach a SOC of 50% to 100%, while measuring the open circuit voltage ($V_c$) according to the state of charge ($SOC_x$). This is then repeated for each charge current.

Here, the charging current is applied by increasing the charging current value in a stepwise manner from low to high. For example, if the charging current is set to 0.5 C, 0.75 C, 1.0 C, 1.25 C, 1.5 C, 1.75 C, 2.0 C, 2.25 C, 2.5 C, 2.75 C, 3.0 C, the charging current is applied in the order described above while repeating the measurement of the open circuit voltage according to the state of charge. That is, after performing the step of measuring the open circuit voltage according to the state of charge with a charging current of 0.5 C, the battery cell is discharged, and the step of measuring the open circuit voltage according to the state of charge with a charging current of 0.75 C is performed, and this process is repeated for 1.0 C, 1.25 C, 1.5 C, 1.75 C, 2.0 C, 2.25 C, 2.5 C, 2.75 C, 3.0 C, respectively.

In one specific example, the process (b) may further include, between each of the steps of measuring an open circuit voltage ($V_c$) according to the state of charge ($SOC_x$) by charge current, performing charge/discharge compensation, wherein the charge/discharge compensation may include discharging to the reference current of the process (a), and charging and discharging again with the reference current.

The process of performing this charge/discharge compensation has the effect of removing the cumulative effect on the battery cells from the previous stage of charging experiments.

The processes (a), (b) will be described with a specific example.

For a battery cell at SOC 0%, the process (a) is to measure the open-circuit voltage ($V_{ref}$) in the charging direction at every SOC 5% interval, while applying a charging current of 0.33 C, with the reference current set to 0.33 C. That is, at SOC 5%, SOC 10% . . . (omitted) . . . . SOC 100%, the respective open-circuit voltage ($V_{ref}$) is measured.

The process (b), for example, sets the charging current values at intervals of 0.25 C within a range of 0.5 C to 3.0 C, and applies the set charging current to the battery cell as in the process (a), while measuring the open circuit voltage ($V_c$) according to the state of charge ($SOC_x$).

Specifically, the battery cell charged to 0.33 C by the process (a) is discharged to SOC 0% with a discharging current of 0.33 C, and the battery cell is charged to SOC 100% by the process (b) while applying a charging current of 0.5 C, which is the lowest charging current value. While charging the battery cell in this manner, the open circuit voltage ($V_c$) at each SOC 5% interval (SOC 5%, SOC 10% .... SOC 100%) is measured. After this process of measuring the open circuit voltage ($V_c$) for a charging current of 0.5 C, the battery can be discharged at 0.33 C and then charged and discharged with 0.33 C to perform a charge/discharge compensation.

Then, for a charging current of 0.75 C, which is higher than the 0.5 C above, the same process as above is performed, and thereafter, the above process is repeated while increasing the charging current value step by step, and the open circuit voltage ($V_c$) according to the state of charge ($SOC_x$) is measured.

The process (c) is to substitute the measured values $V_{ref}$, $V_c$ measured through the process of (a), (b) into the above Equation 1 to calculate the internal resistance value ($R_{SOCx}$) according to the state of charge ($SOC_x$), and to collect the internal resistance profile plotting the internal resistance value according to the state of charge ($SOC_x$) by each charging current.

Figure 2:
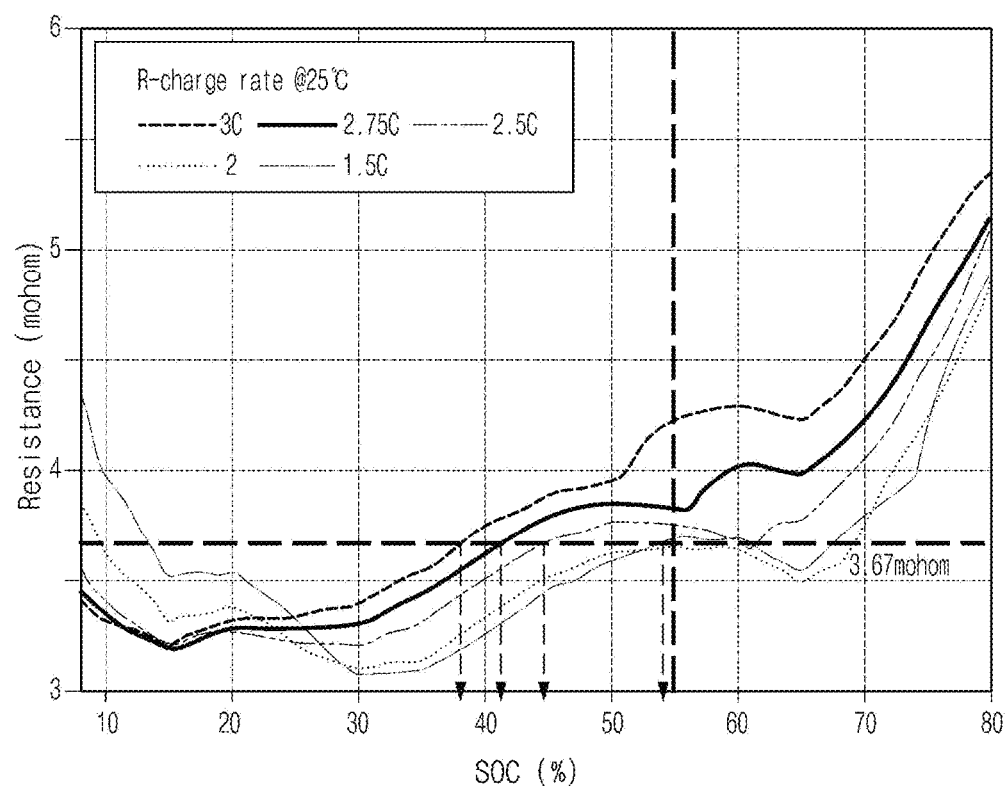
FIG. 2 is a diagram illustrating an internal resistance profile by charging current collected according to an exemplary embodiment of the present disclosure.

FIG. 2 is a diagram illustrating an internal resistance profile, by charging current, collected according to the process (c), according to an exemplary embodiment of the present disclosure. According to the process (b), the open circuit voltage according to the state of charge by charging currents (1.5 C, 2.0 C, 2.5 C, 2.75 C, 3 C) is measured, and according to the process (c), the measured open circuit voltage value is substituted into the above Equation 1 to calculate the internal resistance value according to the state of charge by the charging current, and plotting the state of charge on the x-axis and the internal resistance value on the y-axis to obtain an internal resistance profile in which the internal resistance value according to the state of charge is plotted, as shown in FIG. 2.

The process (d) analyzes the internal resistance profiles by charging current shown in FIG. 2 to determine the limit state of charge by reference resistance value and charging current.

Referring to FIG. 2, the internal resistance value ($R_{SOCx}$) according to the state of charge ($SOC_x$) tends to decrease for an initial state of charge interval, then increases, decreases again, and then increases.

Specifically, the internal resistance profile for a charging current of 1.5 C shows that at a state of charge of about SOC 30%, there is a first inflection point where the internal resistance value changes from a decreasing trend to an increasing trend, and a second inflection point where the internal resistance value changes from an increasing trend to a decreasing trend at a state of charge of about 55% SOC. In each of the internal resistance profiles for charging currents of 2.0 C to 3 C, a second inflection point is also observed where the internal resistance value changes from an increasing trend to a decreasing trend as the state of charge increases. And, in the present disclosure, among the internal resistance values at the second inflection point, the smallest resistance value is determined as a reference resistance value.

Referring to FIG. 2, the internal resistance value of the second inflection point in the internal resistance profile of a charging current of 1.5 C is about 3.67 mΩ, the internal resistance value of the second inflection point in the internal resistance profile of a charging current of 2.0 C is about 3.67 mΩ, the internal resistance value of the second inflection point in the internal resistance profile of a charging current of 2.5 C is about 3.71 mΩ, the internal resistance value of the second inflection point in the internal resistance profile of a charging current of 2.75 C is about 4.0 mΩ, and internal resistance value of the second inflection point in the internal resistance profile of a charging current of 3.0 C is about 4.25 mΩ. Therefore, the reference resistance value of the battery cell having the internal resistance profile of FIG. 2 is determined to be 3.67 mΩ, which has the smallest value among these internal resistance values.

In this way, the process (d) identifies each inflection point where the internal resistance value ($R_{SOCx}$) changes from an increasing trend to a decreasing trend in the profile by charging current collected above, and determines the smallest resistance value among the inflection points by charging current as the reference resistance value.

Once the reference resistance value is determined, the state of charge with the reference resistance value is determined as the limit state of charge in the profile by charging current. Referring to FIG. 2, in the graph showing the internal resistance profiles, a dotted line parallel to the x-axis having an internal resistance value of 3.67 mΩ is drawn, and the x-axis value at the point where the internal resistance profile and the dotted line intersect can be determined as the limit state of charge. Specifically, the x-axis coordinate of the point where the internal resistance profile and the dotted line intersect at a charging current of 3.0 C is about SOC 38%, and the limit state of charge corresponding to a charging current of 3.0 C is determined to be about SOC 38%.

As shown above, in the internal resistance profile by charging current, the SOC, which is the x-axis coordinate of the point where the y-axis coordinate has the reference resistance value, is determined as the limit state of charge for the corresponding charging current. When the limit state of charge for each charging current from 2.75 C to 1.5 C is determined in this manner, the limit state of charge for the charging current of 2.75 C is about SOC 41%, the limit state of charge for the charging current of 2.5 C is about SOC 45%, the limit state of charge for the charging current of 2.0 C is about SOC 55%, and the limit state of charge for the charging current of 1.5 C is about SOC 55%.

In one particular example, the inflection point may be an inflection point corresponding to a second inflection point when the graphical representation of the internal resistance profile by charging current is viewed as a 'W' shape. Furthermore, in one embodiment, the second inflection point may be located within the interval in which the state of charge is between SOC 40% and SOC 60%.

In one embodiment, the method of establishing a charging protocol according to the present disclosure may further include mapping the charging protocol based on the limit state of charge by charging current.

In one embodiment, the mapping process may map charge at a corresponding charging current up to a limit state of charge by charging current, but maps so that the charging current decreases as the state of charge increases.

Referring to FIG. 2, a charging current of 3.0 C has a limit state of charge of about SOC 38%, a charging current of 2.75 C has a limit state of charge of about SOC 41%, a charging current of 2.5 C has a limit state of charge of about SOC 45%, a charging current of 2.0 C has a limit state of charge of about SOC 55%, a charging current of 1.5 C has a limit state of charge of about SOC 55%, and an exemplary embodiment of a charging protocol mapped based on the above may be as follows.

State of charge interval from SOC 0% to SOC 38%: 3.0 C

State of charge interval from SOC 38% to SOC 41%: 2.75 C

State of charge interval from SOC 41% to SOC 45%: 2.5 C

State of charge interval from SOC 45% to SOC 55%: 2.0 C

However, charging protocols mapped according to the present disclosure are not limited to these. Charging protocols according to other embodiments may be as follows.

State of charge interval from 0% SOC to 35% SOC: 3.0 C

State of charge interval from SOC 35% to SOC 45%: 2.5 C

State of charge interval from SOC 45% to SOC 55%: 1.5 C

In an exemplary embodiment, the mapping process may be mapping to a state of charge interval having a state of charge of 55% or less.

According to exemplary embodiments of the present disclosure, the reference resistance values are found in the state of charge interval of SOC 50% to SOC 60%, more specifically in the state of charge interval of SOC 50% to SOC 55%, so that in the state of charge interval of SOC 60% or less, more specifically in the state of charge interval of SOC 55% or less, a charging protocol can be established according to the present disclosure. For a state of charge interval exceeding the above range, charging can be performed according to a conventional charging protocol that can be referenced, or a charging protocol derived using a conventional three-electrode cell can be referenced.

In the prior art method of establishing a charging protocol, in order to derive the limit state of charge, a three-electrode cell with a capacity of 50 mAh was manufactured in advance to derive the Li-plating point according to the negative electrode potential as the limit state of charge, but the present disclosure does not require the manufacture of a three-electrode cell, and the limit state of charge can be derived directly through the calculation of the internal resistance value for a large capacity two-electrode battery cell with a capacity of 40-200 Ah.

Figure 3:
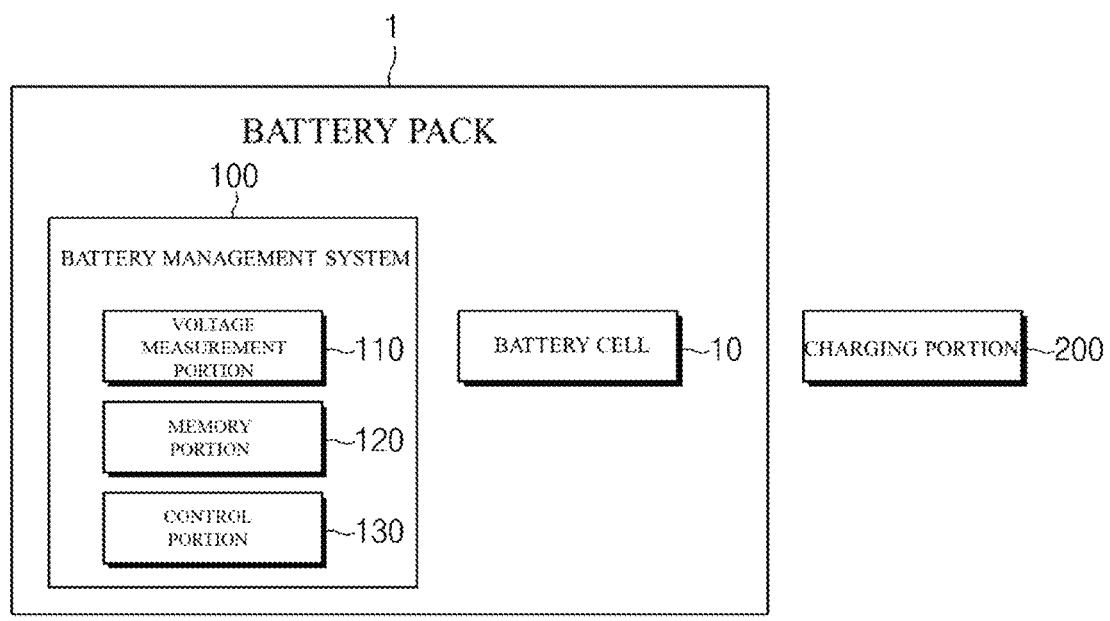
FIG. 3 is an illustration of an exemplary configuration of a battery pack including a battery management system according to an exemplary embodiment of the present disclosure.
Figure 4:
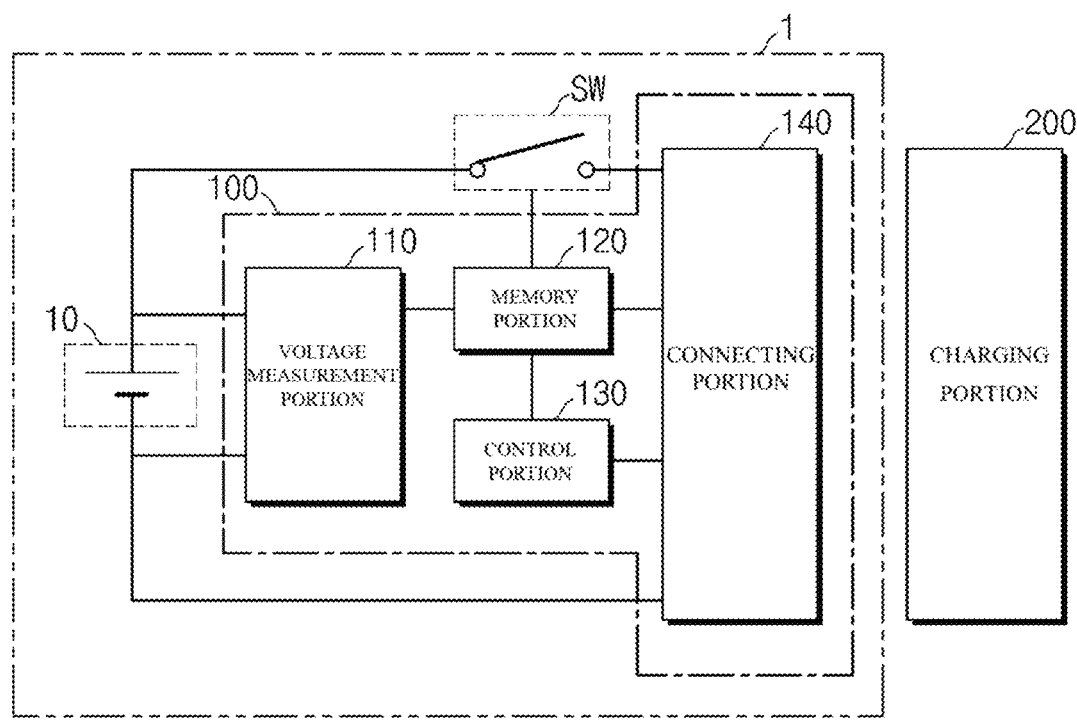
FIG. 4 is a diagram schematically illustrating a battery pack including a battery management system according to an exemplary embodiment of the present disclosure.

FIG. 3 is a diagram exemplifying a configuration of a battery pack including a battery management system according to an exemplary embodiment of the present disclosure, and FIG. 4 is a diagram schematically illustrating a battery pack including a battery management system according to an exemplary embodiment of the present disclosure.

Referring to FIG. 3, the battery pack 1 may include a battery cell 10 and a battery management system 100. The battery management system 100 is a battery management system that monitors the voltage, current, temperature, and the like of the battery cell 10 to control and manage them to prevent overcharging and overdischarging, and the like.

As used herein, battery cell 10 refers to a two-electrode battery cell with a negative electrode and a positive electrode, which is a single, physically separable cell. In one example, a pouch-type lithium polymer cell may be considered a battery cell 10. Further, the battery cell 10 may be a large capacity battery cell having a capacity in the range of 40 to 200 Ah.

The battery pack 1 may also include a battery module with one or more battery cells 10 connected in series and/or parallel.

Referring to FIG. 3, a battery management system according to the present disclosure may include a voltage measurement portion 110, a memory portion 120, and a control portion 130.

The voltage measurement portion 110 is configured to measure the status information of the battery cell, which includes at least one of a voltage and a state of charge for the battery cell 10. The voltage measurement portion 110 according to an exemplary embodiment of the present disclosure is configured to measure an open circuit voltage ($V_{ref}$, $V_c$) according to the state of charge ($SOC_x$), when charged with a reference current and various values of a charging current, for the battery cell, in order to calculate an internal resistance value of the two-electrode battery cell 10 having a positive electrode and a negative electrode.

In one specific example, the voltage measurement portion 110 measures an open circuit voltage ($V_{ref}$) according to the state of charge ($SOC_x$) when a reference current is applied to the battery cell 10, and when a charging current (Ic) of various values set at intervals of 0.25 C, such as 0.25 C-0.5 C-0.75 C . . . 2.75 C-3.0 C is applied to the battery cell 10, it may be configured to measure the open circuit voltage ($V_c$) according to the state of charge ($SOC_x$). Here, the open circuit voltage $V_c$ may be measured at intervals of SOC 2.5%, SOC 5%, or SOC 10%.

The memory portion 120 is configured to calculate the internal resistance value $R_{SOCx}$ according to the state of charge $SOC_x$, by substituting the measured values $V_{ref}$, $V_c$ into Equation 1 below, and to collect, for each charging current, an internal resistance profile plotting the internal resistance value $R_{SOCx}$ according to the state of charge $SOC_x$.

$$\text{Internal resistance value } (R_{SOCx})=(V_c-V_{ref})/Ic \quad \text{[Equation 1]}$$

(In the above Equation 1, Ic means the applied current value for each charging current)

The control portion 130 is configured to identify each inflection point where the internal resistance value $R_{SOCx}$ changes from an increasing trend to a decreasing trend in the above collected internal resistance profile by charging current, determine the lowest resistance value among the inflection points as the reference resistance value, and determine the state of charge having the reference resistance value as the limit state of charge in the internal resistance profile by charging current.

In one particular example, the control portion 130 may determine the second inflection point as the inflection point when the graphical shape of the internal resistance profile by charging current is viewed as a 'W' shape.

In the embodiment of FIG. 2, the battery management system 100 according to the present disclosure may further include a connecting portion 140 configured to connect with a charging portion 200 capable of providing a charging current to the battery cell, according to a charging protocol established by the control portion.

The charging portion 200 may be connected to the battery pack 1. And, the charging portion 200 connected with the battery pack 1 may supply a charging current to the battery cell 10 according to a charging protocol established by the control portion.

And, the battery management system 100 may control the operation of the switching portion SW to control the charging and discharging of the battery cells 10 and/or battery modules.

The battery management system according to the present disclosure has the effect that the measurement portion, the memory portion, and the control portion can charge the battery cell according to a charging protocol that reflects the resistance of a large capacity battery cell and the heat generation caused by quick charging.

Figure 5:
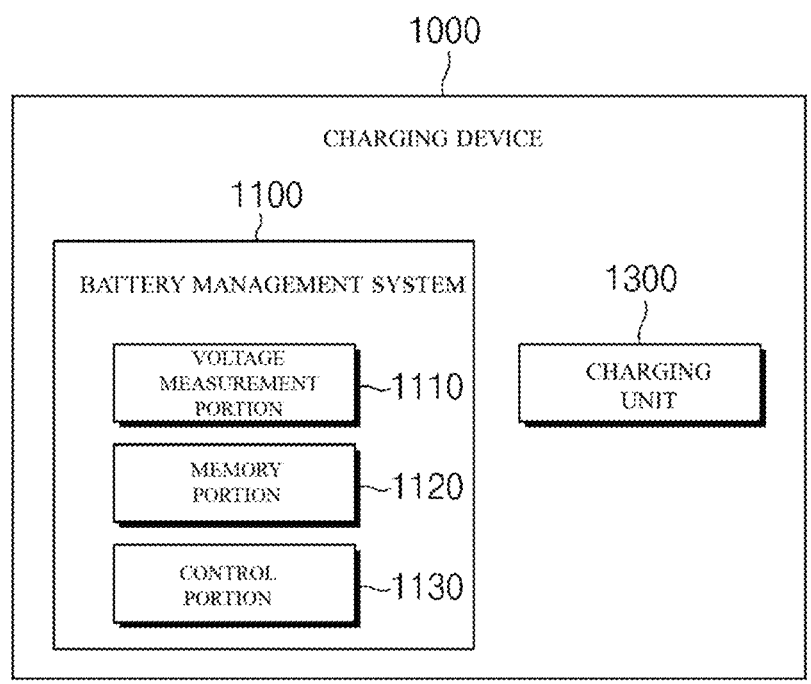
FIG. 5 is a block diagram of a charging device for battery cells according to an exemplary embodiment of the present disclosure.

FIG. 5 is a block diagram of a charging device for a battery cell according to an exemplary embodiment of the present disclosure. Referring to FIG. 5, a charging device 1000 for battery cells according to the present disclosure includes a battery management system 1100; and a charging unit 1300 configured to provide a charging current to a battery cell in accordance with a charging protocol created to reflect the limit state of charge per charging current.

The battery management system 1100 may include a voltage measurement portion 1110, a memory portion 1120, and a control portion 1130. The voltage measurement portion 1110, memory portion 1120, and control portion 1130 have been described in detail previously and will not be described in further detail.

The charging unit 1300 is configured to supply a charging current to the battery cell 10, according to a charging protocol established by the control portion 1130.

Hereinafter, a battery management system of the present disclosure that derives a limit state of charge corresponding to a charging current and establishes a charging protocol according to the present disclosure will be described in detail with specific examples.

Example 1

For a battery cell with a capacity of 40 Ah and a SOC of 0%, charging at a charging current of 0.33 C, the voltage measurement portion measured the open circuit voltage ($V_{ref}$) of the battery cell at a state of charge interval of SOC 2.5%, and the memory portion stored this.

The control portion then discharged the battery cell with a discharging current of 0.33 C, and controlled the charge and discharge portions to apply a charging current of 1.5 C to the discharged battery cell. When the battery cell was charged to 1.5 C, the voltage measurement portion measured the open circuit voltage ($V_c$) of the battery cell at a state of charge interval of SOC 2.5%, and the memory portion stored this. Then, the control portion discharged the charged battery cell with a discharging current of 0.33 C and controlled the charge and discharge portions to perform charging and discharging at 0.33 C.

Then, the control portion repeated the above process while varying the value of the charging current, but controlled the charging and discharging portions to increase the applied charging current step by step, such as 1.5 C-2.0 C-2.5 C-2.75 C-3.0 C, and the voltage measurement portion measured the open circuit voltage ($V_c$) according to the state of charge ($SOC_x$) by charging current as described above, and the memory portion stored this.

Charging and discharging of the battery cells was performed in a chamber set at 25 degrees Celsius.

Furthermore, the memory portion calculated the internal resistance value ($R_{SOCx}$) according to the state of charge ($SOC_x$) by substituting the above measured values ($V_{ref}$, $V_c$) into the Equation 1 below, and collected the internal resistance profile plotting the internal resistance value ($R_{SOCx}$) according to the state of charge ($SOC_x$) by the charging current, and the result is shown in FIG. 2.

Internal resistance value $(R_{SOCx})=(V_c-V_{ref})/Ic$     [Equation 1]

(In the above Equation 1, Ic means the applied current value for each charging current)

Figure 6:
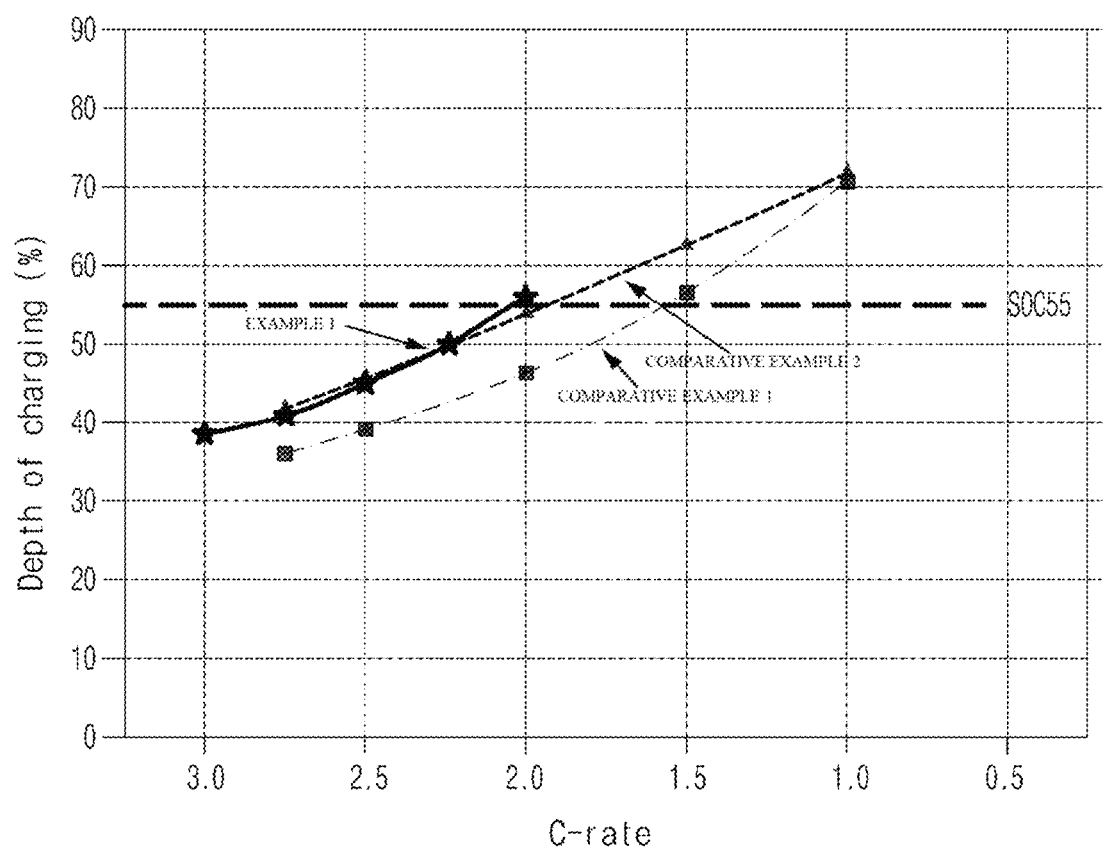
FIG. 6 is a graph illustrating a limit state of charge by charging current derived according to Example 1 and Comparative Examples 1,2.

In the internal resistance profile by charging current shown in FIG. 2, the control portion identifies each inflection point where the internal resistance value ($R_{SOCx}$) changes from an increasing trend to a decreasing trend, determines the lowest resistance value (3.67 mΩ) among the inflection points by charging current as the reference resistance value, and determines the state of charge having the reference resistance value in the profile by charging current as the limit state of charge, which is shown in Table 1 and FIG. 6.

TABLE 1

| Charging current | 3.0 C | 2.75 C | 2.5 C | 2.0 C | 1.5 C |
|---|---|---|---|---|---|
| Example 1 | SOC 38% | SOC 41% | SOC 45% | SOC 55% | SOC 55% |

Comparative Example 1

Using a three-electrode cell, which is a conventional method of establishing a charging protocol, charge and discharge were performed at a temperature of 25 degrees Celsius to derive a limit state of charge by charging current, and a charging protocol established based on this is shown in FIG. 6. In this case, the limit state of charge was determined by measuring the negative electrode potential (CCV) according to the state of charge (SOC) of the three-electrode cell while charging at a charging current set at 0.25° C. intervals in the range of 1.0 C to 2.75 C for a mono-cell of 50 mAh, and determining the state of charge at the point where the negative electrode potential begins to stabilize without dropping as the limit state of charge.

Comparative Example 2

The limit state of charge by charging current was determined in the same way as in Comparative Example 1 above, except that the temperature was set to 35 degrees Celsius, and the results are shown in FIG. 6.

Referring to FIG. 6, it can be seen that the value of the limit state of charge by charging current derived according to Example 1 is very similar to the value of the limit state of charge by charging current derived according to Comparative Example 2. From this, it can be seen that the limit state of charge derived according to the charging protocol establishment method of the present disclosure can reflect the resistance and heat generation of a large capacity battery cell.

Experimental Example 1

A battery cell (Preparation Example 1) used in Example 1, and a battery cell (Preparation Example 2) in which the composition of the negative electrode was changed to provide excellent quick charging capability, was prepared from the battery cell of Preparation Example 1.

For the battery cells of Preparation Example 1 and Preparation Example 2, a charging protocol was established by deriving the limit state of charge by charging current in the same manner as in Example 1. As a result, the charging protocol for the battery cell of Preparation Example 1 required 28.4 minutes to charge (first charging protocol), and the charging protocol for the battery cell of Preparation Example 2 required 21.7 minutes to charge (second charging protocol).

Figure 7:
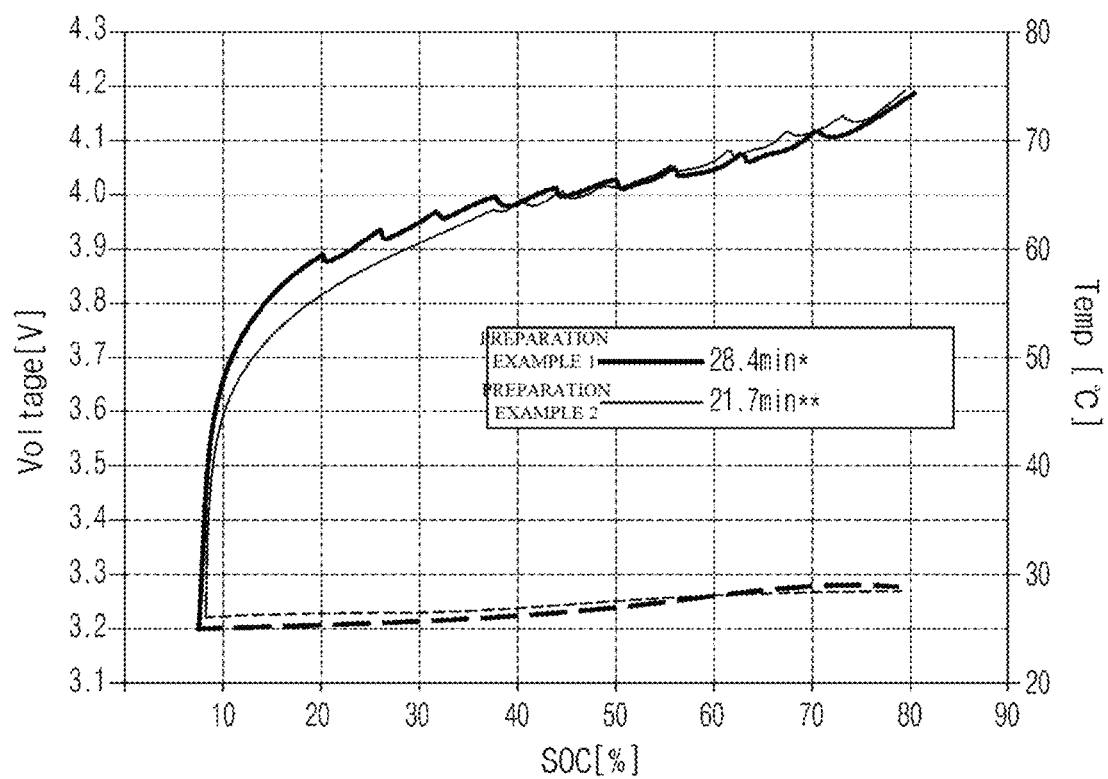
FIG. 7 is a diagram illustrating the results of measuring the open circuit voltage according to the state of charge according to Experimental Example 1.

For the battery cell of Preparation Example 1, charging is performed according to the first charging protocol, and the open circuit voltage according to the state of charge is measured and the result is shown in FIG. 7. For the battery cell of Preparation Example 2, charging is performed according to the second charging protocol, and the open circuit voltage according to the state of charge is measured, and the results are shown in FIG. 7.

Referring to FIG. 7, it can be seen that the battery cell of Preparation Example 1 and the battery cell of Preparation Example 2 exhibit similar voltage profiles. Thus, it can be seen that the method of establishing a charging protocol according to the present disclosure has the effect of enabling the establishment of a protocol that uses a similar state of charge for battery cells with different electrode compositions.

Example 2

For a battery cell having a capacity of 40 Ah, but having a different electrode composition and footprint than in Example 1, and having a SOC of 0%, while charging with a charging current of 0.33 C, the voltage measurement portion measured the open circuit voltage ($V_{ref}$) of the battery cell every time an increase in the state charge of 2.5% was reached, and the memory part stored this.

The control portion then discharged the battery cell with a discharging current of 0.33 C, and controlled the charge and discharge portions to apply a charging current of 1.5 C to the discharged battery cell. When the battery cell was charged to 1.5 C, the voltage measurement portion measured the open circuit voltage ($V_c$) of the battery cell at a state of charge interval of SOC 2.5%, and the memory portion stored this. Then, the control portion discharged the charged battery cell with a discharging current of 0.33 C and controlled the charge and discharge portions to perform charging and discharging at 0.33 C.

Then, the control portion repeated the above process while varying the value of the charging current, but controlled the charging and discharging portions to increase the applied charging current step by step, such as 0.75 C-1.0 C-1.25 C-1.5 C-2.0 C-2.25 C-2.5 C-2.75 C-3.0 C, and the voltage measurement portion measured the open circuit voltage ($V_c$) according to the state of charge ($SOC_x$) by charging current as described above, and the memory portion stored this.

Furthermore, the memory portion calculated the internal resistance value ($R_{SOCx}$) according to the state of charge ($SOC_x$) by substituting the above measured values ($V_{ref}$, $V_c$) into the Equation 1 below, and collected the internal resistance profile plotting the internal resistance value ($R_{SOCx}$) according to the state of charge ($SOC_x$) by the charging current, and the result is shown in FIG. 2.

Internal resistance value $(R_{SOCx})=(V_c-V_{ref})/Ic$      [Equation 1]

(In the above Equation 1, Ic means the applied current value for each charging current)

Figure 8:
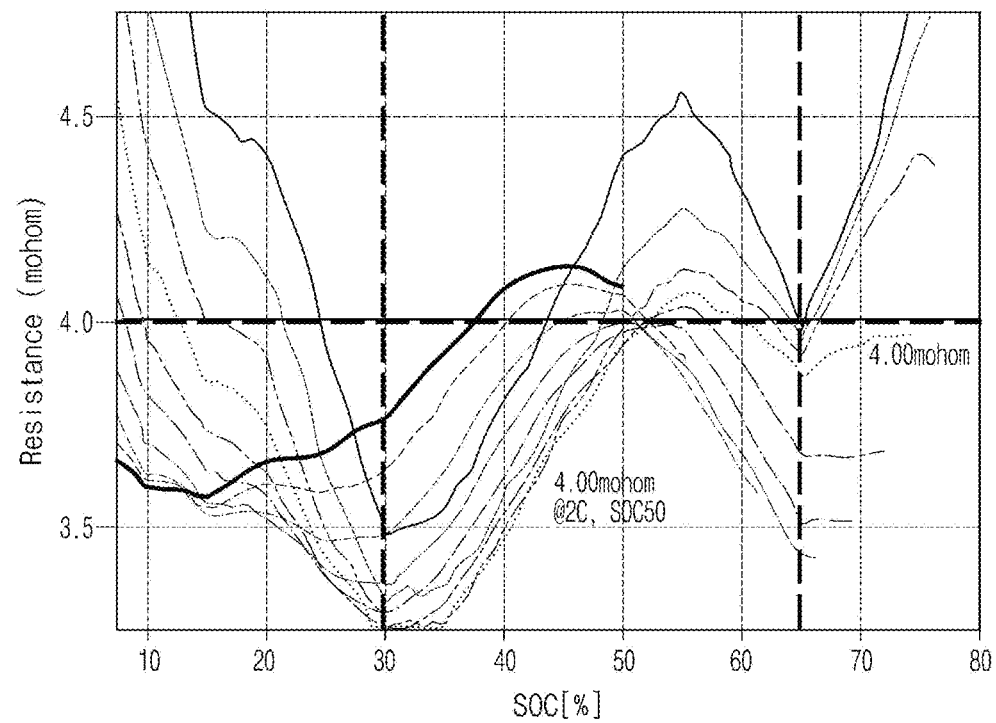
FIG. 8 is a diagram illustrating an internal resistance profile by charging current derived according to Example 2.
Figure 9:
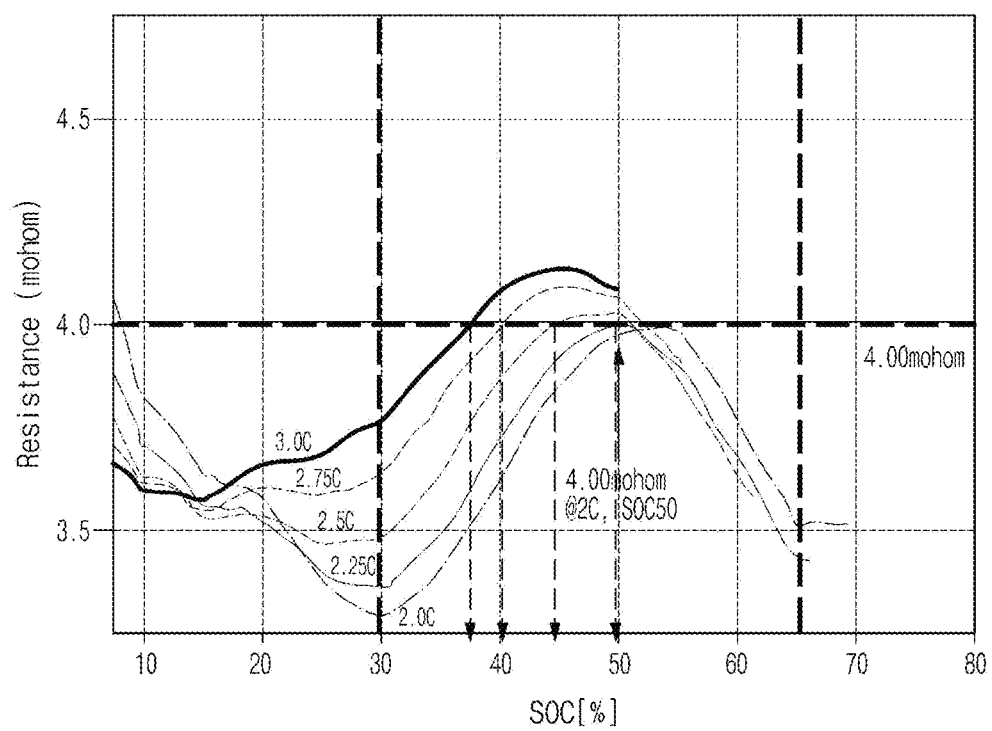
FIG. 9 is a diagram illustrating the results for partial charging currents in FIG. 8.

The results are shown in FIGS. 8 and 9. The control portion then identified each inflection point in the collected profile by charging current where the internal resistance value ($R_{SOCx}$) changed from an increasing trend to a decreasing trend, and determined the lowest resistance value among the inflection points as the reference resistance value. As a result, the reference resistance was found to be 4.00 mΩ.

Example 3

Figure 10:
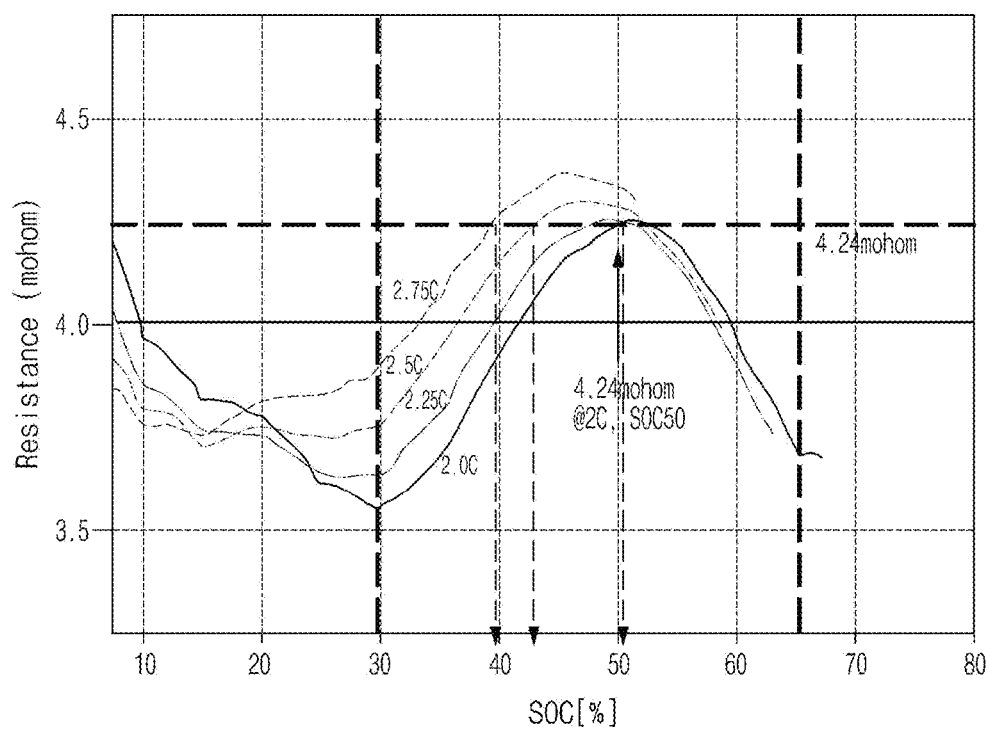
FIG. 10 is a diagram illustrating an internal resistance profile by charging current derived according to Example 3.

A battery cell with a capacity of 40 Ah and the same model as in Example 2 was prepared, and the internal resistance value ($R_{SOCx}$) was calculated using the same method as in Example 2, and the internal resistance profile was collected for each charging current. The result is shown in FIG. 10. Then, from the internal resistance profile shown in FIG. 10, the reference resistance value was determined using the same method as in Example 2. As a result, the reference resistance value was found to be 4.24 mΩ.

Referring to FIGS. 8 to 10, it can be seen that although the respective reference resistance values determined according to Example 2 and Example 3 are different, the limit state of charge by charging current are similar. Thus, the charging protocol establishment method according to the present disclosure has the effect of providing a charging protocol with the same standard despite the deviation of the battery cell, as it can be confirmed that the limit state of charge by charging current is similar even though the reference resistance value is different.

Example 4

A battery cell (capacity: 40 Ah) having the same specifications as the battery cell used in Example 1 was connected to an electrochemical charger and discharger. Based on the limit state of charge by charging current listed in Table 1 of Example 1, a charge and discharge protocol was mapped as shown in Table 2 below, the battery cell was fully charged to SOC 100% according to the mapped charge and discharge protocol, and the fully charged battery cell was fully discharged to SOC 0% with a constant current of 0.33 C.

TABLE 2

| SOC 0%~SOC 38% | SOC 38%~SOC 45% | SOC 45%~SOC 55% | SOC 55%~SOC 100% |
|---|---|---|---|
| 3.0 C | 2.5 C | 2.0 C | 0.33 C |

Comparative Example 3

A battery cell (capacity: 40 Ah) with the same specifications as the battery cell used in Example 1 was connected to the electrochemical charger and discharger. The battery cell was fully charged to SOC 100% with a constant current of 0.33 C, and then the fully charged battery cell was fully discharged to SOC 0% with a constant current of 0.33 C.

Experimental Example 2: Measuring Charge and Discharge Time

For each case of charging according to the method of Example 4 and charging according to the method of Comparative Example 3, the time required for charging was measured and the results are shown in Table 3.

Experimental Example 3: Evaluating Capacity Retention Rate

After charging and discharging according to each method of Example 4 and Comparative Example 3, but repeating 200 cycles of charging and discharging, the capacity retention rate calculated according to Equation 1 below is shown in Table 3.

(Discharge capacity at 200 cycles×100)/Discharge capacity at first cycle      Equation 1:

TABLE 3

|  | Example 4 | Comparative Example 3 |
|---|---|---|
| Charging time (min) | 94 | 180 |
| Capacity retention rate (%) | 88 | 90 |

Referring to Table 3, the time required for charging according to the charging protocol according to Example 4 is significantly reduced compared to the time required for charging according to the charging method according to Comparative Example 3. Furthermore, the capacity retention rate when charging according to the charging protocol according to Example 4 was equivalent to the capacity retention rate when charging according to the charging method according to Comparative Example 3, which confirms that the charging protocol derived according to the present disclosure does not cause capacity degradation of the battery cell.

REFERENCE NUMERALS

1: BATTERY PACK
10: BATTERY CELL
100: BATTERY MANAGEMENT SYSTEM
110: VOLTAGE MEASUREMENT PORTION
120: MEMORY PORTION
130: CONTROL PORTION
200: CHARGING PORTION

What is claimed is:

1. A method for establishing a lithium secondary battery charging protocol comprising:
(a) measuring a first open-circuit voltage ($V_{ref}$) according to a state-of-charge ($SOC_x$) for a two-electrode battery cell with a positive electrode and a negative electrode, when charged with a reference current;
(b) measuring a plurality of second open circuit voltages ($V_c$) according to the state-of-charge ($SOC_x$) when charging the two-electrode battery cell with a plurality of different charging currents;
(c) calculating an internal resistance value ($R_{SOCx}$) according to the state-of-charge ($SOC_x$) using an equation ($R_{SOCx}$)=($V_c-V_{ref}$)/Ic for each of the different charging currents, wherein Ic is a current value for each of the different charging currents, and computing a charging current-specific internal resistance profile mapping the internal resistance value according to the state-of-charge ($SOC_x$) for each of the different charging currents; and
(d) identifying, for each of the computed charging current-specific internal resistance profiles, each inflection point at which the internal resistance value ($R_{SOCx}$) changes from an increasing trend to a decreasing trend, determining a lowest resistance value among the inflection points for each of the different charging currents as a reference resistance value, and determining, for each of the computed charging current-specific internal resistance profiles, the state-of-charge ($SOC_x$) having the reference resistance value as a limit state-of-charge.

2. The method for establishing the lithium secondary battery charging protocol of claim 1, wherein at least one inflection point corresponds to a second inflection point when a computed charging current-specific internal resistance profile is 'W' shaped.

3. The method for establishing the lithium secondary battery charging protocol of claim 1, wherein at least one inflection point is located within an interval between SOC 40% and SOC 60%.

4. The method for establishing the lithium secondary battery charging protocol of claim 1, wherein the two-electrode battery cell has a capacity between 40 Ah and 200 Ah.

5. The method for establishing the lithium secondary battery charging protocol of claim 1, wherein the reference current is between approximately 0.25 C and approximately 0.4 C.

6. The method for establishing the lithium secondary battery charging protocol of claim 1, wherein each of the different charging currents is between approximately 0.2 C and approximately 6 C.

7. The method for establishing the lithium secondary battery charging protocol of claim 1, wherein charging the two-electrode battery cell with the plurality of different charging currents in (b) further comprises charging the two-electrode battery cell to between approximately SOC 50% and approximately SOC 100% for each of the different charging currents.

8. The method for establishing the lithium secondary battery charging protocol of claim 1, wherein the plurality of different charging currents increase in a stepwise manner from a lower to a higher current.

9. The method for establishing the lithium secondary battery charging protocol of claim 1, further comprising
mapping the lithium secondary battery charging protocol based on the limit state-of-charge for each of the different charging currents, wherein
each charging current of the lithium secondary battery charging protocol is below the limit state-of-charge for each of the different charging currents, and the charging current of the lithium secondary battery charging protocol decreases as the state-of-charge increases.

10. The method for establishing the lithium secondary battery charging protocol of claim 9, wherein
the lithium secondary battery charging protocol extends to a state-of-charge below 55% SOC.

11. The method for establishing the lithium secondary battery charging protocol of claim 1, wherein (b) further comprises, between measuring the open circuit voltage ($V_c$) according to the state-of-charge ($SOC_x$) when charging the two-electrode battery cell with each of the plurality of different charging currents performing charge/discharge compensation, wherein charge/discharge compensation comprises:
discharging the two-electrode battery cell with the reference current;
charging the two-electrode battery cell with the reference current; and
discharging the two-electrode battery cell with the reference current.

12. A battery management system comprising:
a voltage measurement portion for measuring: (1) a first open-circuit voltage ($V_{ref}$) according to a state-of-charge ($SOC_x$) for a two-electrode battery cell with a positive electrode and a negative electrode, when charged with a reference current and (2) a plurality of second open circuit voltages ($V_c$) according to the state-of-charge ($SOC_x$) when charging the two-electrode battery cell with a plurality of different charging currents;
a memory portion for calculating an internal resistance value ($R_{SOCx}$) according to the state-of-charge ($SOC_x$) using an equation ($R_{SOCx}$)=($V_c-V_{ref}$)/Ic for each of the different charging currents, wherein Ic is a current value for each of the different charging currents, and for computing a charging current-specific internal resistance profile mapping the internal resistance value according to the state-of-charge ($SOC_x$) for each of the different charging currents; and a control portion for identifying for each of the computed charging current-specific internal resistance profiles, each inflection point at which the internal resistance value ($R_{SOCx}$) changes from an increasing trend to a decreasing trend, for determining a lowest resistance value among the inflection points for each of the different charging currents as a reference resistance value, and for determining, for each of the computed charging current-specific internal resistance profiles, the state-of-charge ($SOC_x$) having the reference resistance value as a limit state-of-charge.

13. The battery management system of claim 12, wherein the control portion identifies at least one inflection point corresponding to a second inflection point when a computed charging current-specific internal resistance profile is 'W' shaped.

14. The battery management system of claim 12, further comprising a connecting portion for connecting to a charging portion for supplying a charging current according to a charging protocol established by the control portion.

15. A battery pack comprising a battery management system according to claim 12.

16. A battery pack charging device comprising:
a battery management system according to claim 12; and
a charging unit for supplying a charging current to a battery cell of the battery pack according to a charging protocol, wherein the charging protocol limits the charging current according to a limit state-of-charge determined by the control portion.

* * * * *